United States Patent

Sawano et al.

[11] Patent Number: 5,853,948
[45] Date of Patent: Dec. 29, 1998

[54] POSITIVE PHOTORESIST COMPOSITIONS AND MULTILAYER RESIST MATERIALS USING THE SAME

[75] Inventors: Atsushi Sawano; Junichi Mizuta; Kousuke Doi; Hidekatsu Kohara; Toshimasa Nakayama, all of Kanagawa-ken, Japan

[73] Assignee: Tokyo Ohka Kogyo Co., Ltd., Kanagawa-Ken, Japan

[21] Appl. No.: 960,621

[22] Filed: Oct. 29, 1997

[30] Foreign Application Priority Data

Oct. 31, 1996 [JP] Japan .................................. 8-305873

[51] Int. Cl.$^6$ ........................................... G03F 7/023
[52] U.S. Cl. .......................... 430/166; 430/191; 430/192; 430/193
[58] Field of Search .................... 430/165, 191, 430/192, 193

[56] References Cited

U.S. PATENT DOCUMENTS 4,424,270  1/1984  Erdmann et al. ................. 430/166
5,229,254  7/1993  Lohaus et al. ..................... 430/270.1

*Primary Examiner*—John S. Chu
*Attorney, Agent, or Firm*—Wenderoth, Lind & Ponack, LLP

[57] ABSTRACT

A positive photoresist composition comprising (A) an alkali-soluble resin; (B) a quinonediazido group containing compound; and (C) at least one sulfonyl halide represented by the following general formula (I):

$$R^1—SO_2—X \qquad (I)$$

where $R^1$ is an alkyl group, a substituted alkyl group, an alkenyl group, an aryl group or a substituted aryl group; X is a halogen atom, as well as a multilayer resist material using this composition. Very fine (<0.4 μm) resist patterns can be formed that have high feature or edge integrity, that provide good contrast between exposed and unexposed areas after development and that assure a wider margin of exposure, better depth-of-focus characteristics and sharper cross-sectional profiles.

10 Claims, No Drawings

POSITIVE PHOTORESIST COMPOSITIONS AND MULTILAYER RESIST MATERIALS USING THE SAME

BACKGROUND OF THE INVENTION

1. Field of the Invention

This invention relates to positive photoresist compositions and multilayer resist materials using the same. More particularly, the invention relates to positive photoresist compositions which are capable of forming half-a-micron order or even finer resist patterns that have high feature or edge integrity, provide good contrast between exposed and unexposed areas after development and assure a wider margin of exposure, better depth-of-focus characteristics and sharper cross-sectional profiles. The invention also relates to multilayer resist materials using such improved positive photoresist compositions.

2. Description of Related Art

In the process of fabricating semiconductor devices such as ICs and LSIs and liquid-crystal devices such as LCDs, positive photoresist compositions comprising the combination of film-forming alkali-soluble resins and a light-sensitive component made of quinonediazido group containing compounds are used commercially on account of their high resolution, sensitivity and resistance to etching.

With the ever increasing degree of integration in semiconductor devices, a demand has arisen in modern VLSI production to process superfine patterns in as high precision as to realize feature sizes not more than half a micron meter (e.g. 0.4 $\mu$m or 0.35 $\mu$m) and, in this case, too, photoresist compositions are desired that can form resist patterns which have high resolution, wide margin of exposure and good depth-of-focus characteristics and which feature rectangular cross sections. However, when forming 0.4 $\mu$m and finer resist patterns, it is not easy to ensure sharply defined rectangular cross-sectional profiles and the finer the patterns, the more pronounced is the narrowing of the top of each pattern element at both shoulders to produce a tapered profile, which generally has a small depth of focus.

In recent years, several techniques have been reported with a view to providing better pattern profiles by modifying the light-sensitive component of photoresists. Referring to Unexamined Published Japanese Patent Application Nos. 301848/1992, 301849/1992, 301850/1992, 301851/1992, etc., it is proposed that mixed esters in which a portion of the hydroxyl groups in specified phenolic compounds are quinonediazidosulfonated and another portion of the hydroxyl groups are esterified with sulfonic acids and/or carboxylic acids should be used as the light-sensitive component. However, none of these proposals have achieved practically satisfactory improvements in pattern profiles and, in particular, the resist composition using a quinonediazidosulfonic acid ester of polyhydroxybenzophenone has only insufficient resolution in lithography with i-line (365 nm); in addition, the solubility in resist solvents is so low that unwanted precipitation of the light-sensitive component will occur in the photoresist solution.

Under the circumstances, attempts are being made to improve the overall photoresist characteristics including feature definition not only by modifying the light-sensitive component but also by incorporating other additives. Take, for example, Unexamined Published Japanese Patent Application No. 275955/1990, which proposes that tris (hydroxyphenyl)-methanes such as bis(2,5-dimethyl-4-hydroxyphenyl)-2-hydroxyphenylmethane be added as a sensitivity enhancer. Unexamined Published Japanese Patent Application No. 200252/1991 teaches the addition of 1-[1-(4-hydroxyphenyl)-isopropyl]-4-[1,1-bis(4-hydroxyphenyl)ethyl]benzene, and Unexamined Published Japanese Patent Application No. 200253/1991 teaches the addition of 1,4-bis[2-(3,5-dimethyl-4-hydroxyphenyl)-2-propyl]benzene.

The addition of such polyphenolic compounds having 3 or 4 benzene rings is highly effective for sensitivity improvement; on the other hand, the feature or edge integrity is rather low and the contrast between exposed and unexposed areas after development is insufficient to provide completely satisfactory margin of exposure and depth-of-focus characteristics when forming 0.40 $\mu$m or even finer resist patterns; in addition, it is difficult to form resist patterns having sharp cross-sectional profiles.

Unexamined Published Japanese Patent Application No. 301204/1994 teaches resists incorporating tris (hydroxyphenyl)methanes having a cyclohexyl group. Such polyphenolic compounds are also useful as sensitivity enhancers but, again, they are not satisfactory in terms of the margin of exposure and depth-of-focus characteristics.

Unexamined Published Japanese Patent Application No. 248619/1995 teaches compositions which, with a view to suppressing the unwanted precipitation of the light-sensitive component, have p-toluenesulfonic acid and other acidic compounds incorporated in positive photoresists comprising an alkali-soluble resin component and a 1,2-naphtoquinonediaizide based light-sensitive component. However, the compositions do not have high enough storage stability and when forming half-a-micron order or even finer patterns, no satisfactory results are attained in such terms as the margin of exposure, depth-of-focus characteristics and sharp cross-sectional profiles.

Light-sensitive compositions incorporating sulfonyl chloride are described in Unexamined Published Japanese Patent Application Nos. 54334/1983 and 1857/1990; the composition described in the former is of a negative type and provides resist patterns having stronger adhesion to the substrate whereas the composition described in the latter is for use in dry processing and permits silylation at lower temperatures with higher selectivity for dry etching. However, the positive resist pattern formed by either composition fails to solve the aforementioned problems such as those with the margin of exposure, depth-of-focus characteristics and the cross-sectional profile of a pattern element.

Unexamined Published Japanese Patent Application No. 140143/1989 discloses a positive photoresist composition for exposure to deep UV light which comprises a resin having a specified structure and a compound having a sulfonyl chloride group. However, the composition does not have long keeping quality and is unsuitable for the purpose of forming half-a-micron order or even finer patterns using i-line; hence, the aforementioned problems such as those with the margin of exposure, depth-of-focus characteristics and the cross-sectional profile of a pattern element are not completely solved.

When substrates having high-reflection films or steps are used, standing waves or random reflections from the substrates cause either undulations in resist pattern elements or local distortions commonly referred to as "notching". As a technique to suppress these phenomena, a multilayer resist process (BARC) has been proposed, which provides an anti-reflective coating on the silicon substrate or a highly reflective undercoat such as an aluminum or tungsten silicide film. However, the resist patterns formed on the anti-reflective coating using conventional positive photoresists are often characterized by undersized narrow tops or flared bottoms.

With a view to solving the aforementioned problems of the related art, the present inventors conducted intensive studies and found that their objective could be attained by adding specified sulfonyl halides to the combination of alkali-soluble resins and quinonediazido group containing compounds. The present invention has been attained on the basis of this finding.

SUMMARY OF THE INVENTION

An object, therefore, of the invention is to provide positive photoresist compositions which are capable of forming half-a-micron order or even finer (e.g. 0.4 μm or 0.35 μm) resist patterns that have high feature or edge integrity, provide good contrast between exposed and unexposed areas after development and assure a wider margin of exposure, better depth-of-focus characteristics and sharper cross-sectional profiles.

Another object of the invention is to provide a multi-layer resist material which comprises a substrate overlaid with an anti-reflective coating which, in turn, is overlaid with a positive photoresist layer formed of one of said positive photoresist compositions.

Thus, in one aspect, the invention relates to a positive photoresist composition comprising:
(A) an alkali-soluble resin;
(B) a quinonediazido group containing compound; and
(C) at least one sulfonyl halide represented by the following general formula (I):

$R^1-SO_2-X$            (I)

where $R^1$ is an alkyl group, a substituted alkyl group, an alkenyl group, an aryl group or a substituted aryl group; X is a halogen atom.

Preferably, component (C) is a sulfonyl halide represented by the following general formula (II):

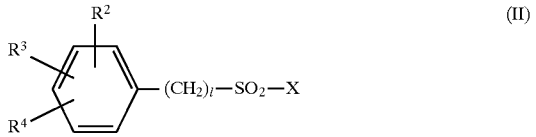

(II)

where $R^2$–$R^4$ are each independently a hydrogen atom, an alkyl group, a substituted alkyl group, an aryl group, a substituted aryl group or a $SO_2X$ group (where X is a halogen atom); $l$ is either 0 or an integer of 1–3.

According to another aspect, the invention relates to a multilayer resist material comprising a substrate overlaid with an anti-reflective coating which, in turn, is overlaid with a positive photoresist layer, said positive photoresist layer being formed of a positive photoresist composition comprising:
(A) an alkali-soluble resin;
(B) a quinonediazido group containing compound; and
(C) at least one sulfonyl halide represented by the stated general formula (I), where $R^1$ and X are each as defined above.

DETAILED DESCRIPTION OF THE INVENTION

The alkali-soluble resin to be used as component (A) in the invention is not limited to any particular types and may be selected from among those which are commonly used as film-forming materials in positive photoresist compositions. Preferred examples include the products of polycondensation reaction between aromatic hydroxy compounds and aldehydes or ketones, as well as polyhydroxystyrenes and derivatives thereof.

Exemplary aromatic hydroxy compounds include: phenols such as phenol, m-cresol, p-cresol and o-cresol; xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenylphenol; arylphenols such as phenylphenol; and polyhydroxyphenols such as 4,4'-dihydroxybiphenyl, bisphenol A, resorcinol, hydroquinone and pyrogallol. These aromatic hydroxy compounds may be used either alone or in admixture. Among these aromatic hydroxy compounds, m-cresol, p-cresol, 2,5-xylenol, 3,5-xylenol and 2,3,5-trimethylphenol are particularly preferred.

Exemplary aldehydes include formaldehyde, paraformaldehyde, trioxane, acetaldehyde, propionaldehyde, butylaldehyde, trimethylacetaldehyde, acrolein, crotonaldehyde, cyclohexanealdehyde, furfural, furylacrolein, benzaldehyde, terephthaldehyde, phenylacetaldehyde, a-phenylpropylaldehyde, p-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamic aldehyde. These aldehydes may be used either alone or in admixture. Among these aldehydes, formaldehyde is preferred because of its easy availability. For the particular purpose of providing improved heat resistance, formaldehyde is preferably used in combination with hydroxybenzaldehydes.

Exemplary ketones include acetone, methyl ethyl ketone, diethyl ketone and diphenyl ketone. These ketones may be used either alone or in admixture.

A particularly preferred combination of aromatic hydroxy compounds and ketones is that of pyrogallol and acetone.

The products of polycondensation reaction between aromatic hydroxy compounds and aldehydes or ketones can be prepared by known procedures in the presence of acidic catalysts. Examples of acidic catalysts that may be used include hydrochloric acid, sulfuric acid, formic acid, oxalic acid and paratoluenesulfonic acid. The resulting polycondensation products are preferably fractionated or otherwise treated to cut off the low-molecular weight region because this will provide better heat resistance. Fractionation and other treatments may typically be carried out by dissolving the resin as the polycondensation reaction product in good solvents such as alcohols (e.g. methanol and ethanol), ketones (e.g. acetone and methyl ethyl ketone), ethylene glycol monoethyl ether acetate and tetrahydrofuran, and then pouring the solution into water to form a precipitate.

The condensation reaction products thus obtained have the low-molecular weight region cut off and their weight average molecular weight ranges from 2,000 to 25,000, preferably from 2,500 to 20,000. The weight average molecular weight is calculated for polystyrene by gel permeation chromatography (GPC).

Exemplary polyhydroxystyrenes and derivatives thereof include homopolymers of vinylphenol and copolymers of vinylphenol with copolymerizable comonomers. Exemplary comonomers include acrylic acid derivatives, acrylonitrile, methacrylic acid derivatives, methacrylonitrile, styrene, and styrene derivatives such as a-methylstyrene, p-methylstyrene, o-methylstyrene, p-methoxystyrene and p-chlorostyrene.

The quinonediazido group containing compounds used as component (B) are the light-sensitive component of the photoresist compositions of the invention and examples include naphthoquinone-1,2-diazidosulfonate ester compounds, orthobenzoquinonediazidosulfonate esters, orthoanthraquinonediazidosulfonate esters, etc. and any compounds may be selected from among commonly used light-sensitive esters without particular limitations. Preferred examples include esters of hydroxy compounds with naphthoquinone-1,2-diazidosulfonyl halides such as naphthoquinone-1,2-diazido-5-sulfonyl chloride, naphthoquinone-1,2-diazido-4-sulfonyl chloride and naphthoquinone-1,2-diazido-6-sulfonyl chloride.

Examples of the ester forming hydroxy compounds include those listed below under (i)–(iii).

(i) Polyhydroxybenzophenones:

Compounds of this class include 2,3,4-trihydroxybenzophenone, 2,4,4'-trihydroxybenzophenone, 2,4,6-trihydroxybenzophenone-2,3,4,4'-tetrahydroxybenzophenone, 2,2',4,4'-tetrahydoxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone and 2,3,3',4,4',5'-hexahydroxybenzophenone.

(ii) Hydroxyaryl compounds represented by the following general formula (III):

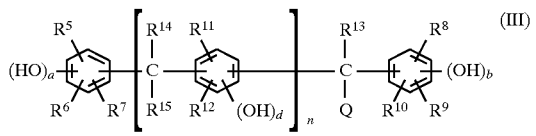

where $R^5$–$R^{12}$ are each independently a hydrogen atom, a halogen atom, an alkyl group having 1–6 carbon atoms, an alkoxy group having 1–6 carbon atoms or a cycloalkyl group; $R^{13}$–$R^{15}$ are each independently a hydrogen atom or an alkyl group having 1–6 carbon atoms; Q is a hydrogen atom, an alkyl group having 1–6 carbon atoms or, when taken together with $R^{13}$, represents a cyclic ring having 3–6 carbon atoms, or a residue represented by the following formula:

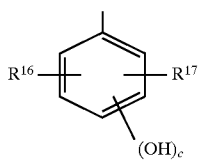

(where $R^{16}$ and $R^{17}$ are each independently a hydrogen atom, a halogen atom, an alkyl group having 1–6 carbon atoms, an alkoxyl group having 1–6 carbon atoms or a cycloalkyl group; c is an integer of 1–3; a and b are each an integer of 1–3; d is an integer of 0–3; and n is an integer of 0–2.

Compounds of this class include:

hydroxyaryl compounds such as tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]-benzene, 1-[1-(3-methyl-4-hydroxyphenyl)isopropyl]-4-[1,1-bis(3-methyl-4-hydroxyphenyl)ethyl]benzene, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane and bis(4-hydroxy-2,3,5-trimethylphenyl)-4-hydroxy-3-methoxyphenylmethane;

bis(hydroxyphenyl)alkane compounds such as 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane and bis(2,4-dihydroxyphenyl)methane; and bis(hydroxyphenyl)cycloalkane compounds such as 1,1-bis(4-hydroxyphenyl)cyclohexane and 1,1-bis(2-methyl-4-hydroxyphenyl)cyclohexane.

Other examples include 2,6-bis[1-(2,4-dihydroxyphenyl)-isopropyl]-4-methylphenol, 4,6-bis[1-(4-(hydroxyphenyl)-isopropyl]resorcin, 4,6-bis(3,5-dimethoxy-4-hydroxyphenylmethyl)pyrogallol, 4,6-bis(3,5-dimethyl-4,6-dihydroxyphenylmethyl)-4-methylphenol and 2,6-bis(2,3,4-trihydroxyphenylmethyl)-4-methylphenol.

Among the compounds represented by the general formula (III), hydroxyaryl compounds represented by the following general formula (IV) are particularly preferred:

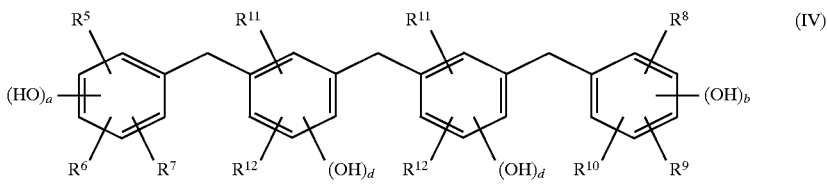

where $R^5$–$R^{12}$ and a, b and d are each the same as defined above. Examples of such compounds are bis[2-hydroxy-3-(2-hydroxy-5-methylbenzyl)-5-methylphenyl]methane represented by the following formula:

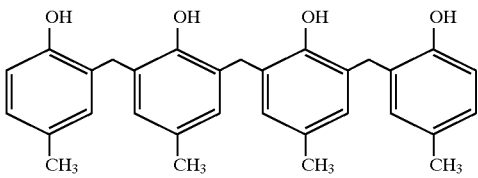

and bis[4-hydroxy-3-(2-hydroxy-5-methylbenzyl)-2,5-dimethylphenyl]methane represented by the following formula:

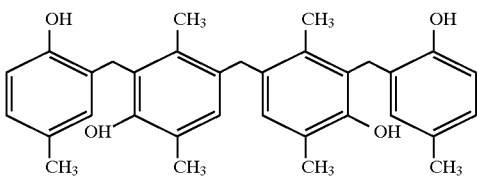

(iii) Phenols:

Compounds of this class include phenol, p-methoxyphenol, dimethylphenol, hydroquinone, bisphenol A, naphthol, pyrocatechol, pyrogallol monomethyl ether, pyrogallol-1,3-dimethyl ether, gallic acid, as well as partially esterified or etherized gallic acid.

Among the hydroxy compounds listed above, the hydroxyaryl compounds represented by the stated general formula (III) are preferably used in order to obtain less-than-half-a-micron patterns which have the salient properties intended by the invention. Particularly preferred are bis[2-hydroxy-3(2-hydroxy-5-methylbenzyl)-5-methylphenyl]methane, bis[4-hydroxy-3(2-hydroxy-5-methylbenzyl)-2,5-dimethylphenyl]methane, bis(3-cyclohexyl-4-hydroxy-6-methylphenyl)-3,4-dihydroxyphenylmethane and 1-[1-(4-hydroxyphenyl)isopropyl]-4-[1,1-bis(4-hydroxyphenyl)-ethyl]benzene.

The above-listed esters (i.e., compounds containing a quinonediazido group) which are usable as the light-sensitive component can be prepared by subjecting the naphthoquinone-1,2-diazidosulfonyl halides which are already described above and the hydroxy compounds (i)–(iii) to a condensation reaction to effect complete or partial esterification. The condensation reaction is typically performed with advantage in organic solvents such as dioxane, N-methylpyrrolidone and dimethylacetamide in the presence of basic condensing agents such as triethanolamine, alkali carbonates and alkali hydrogencarbonates.

Preferably, the hydroxy compounds are condensed with naphthoquinone-1,2-diazido-4(or 5)-sulfonyl halides in moles corresponding to at least 50%, preferably at least 60%, of the total number of moles of the hydroxyl groups in the hydroxy compound, thereby yielding esters with the average degree of esterification being at least 50%, preferably at least 60%. The use of such esters contributes high resolution.

Optionally, a portion of the hydroxyl groups in the hydroxy compounds may be esterified with sulfonyl halides other than naphthoquinonediazidosulfonyl halides as taught in Unexamined Published Japanese Patent Application No. 43841/1997. Thus, the products of esterification of the compounds of the general formula (I) with hydroxy compounds can also be used with advantage as the above-defined light-sensitive component. Specific examples of such esters include: alkanesulfonyl halides having 1–12 carbon atoms such as methanesulfonyl chloride, methanesulfonyl fluoride, ethanesulfonyl chloride, n-propanesulfonyl chloride, n-butanesulfonyl chloride, pentanesulfonyl chloride and dodecanesulfonyl chloride; substituted alkanesulfonyl halides having 1–12 carbon atoms such as chloromethylsulfonyl chloride, dichloromethylsulfonyl chloride, trichloromethylsulfonyl chloride and 2-chloroethylsulfonyl chloride; alkenesulfonyl chlorides having 2 or 3 carbon atoms such as ethylenesulfonyl chloride and 1-propene-1-sulfonyl chloride; arylsulfonyl halides such as benzenesulfonyl chloride, benzenesulfonyl fluoride, benzylsulfonyl chloride, and 1-naphthalenesulfonyl chloride; and alkyl-, alkenyl- and alkoxy-substituted arlysulfonyl halides such as p-toluenesulfonyl chloride, p-ethylbenzenesulfonyl chloride, p-styrenesulfonyl chloride and p-methoxybenzenesulfonyl chloride.

If desired, the composition of the invention may further contain a sensitivity enhancer (sensitizer) to such an extent that it will not impair the preferred performance of the composition. A suitable sensitizer may be selected from among the hydroxyaryl compounds represented by the general formula (III) set forth above. Among the hydroxyaryl compounds of the general formula (III) exemplified hereinabove, the following are preferred for use as the sensitivity enhancer: bis(4-hydroxy-2,3,5-trimethylphenyl)-2-hydroxyphenylmethane, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)-ethyl]benzene, 1-[1-(3-methyl-4-hydroxyphenyl)isopropyl]-4-1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol and 1,1-bis(4-hydroxyphenyl)cyclohexane. Particularly preferred are bis(4-hydroxy-2,3,5-trimethylphenyl)-2-hydroxyphenylmethane, 2,4-bis( 3,5-dimethyl-4-hydroxyphenylmethyl)-6-methylphenol and 4,6-bis[1-(4-hydroxyphenyl)isopropyl]resorcin.

If these hydroxyaryl compounds are to be incorporated as a sensitivity enhancer, their content is preferably selected from the range of 5–50 wt %, more preferably 10–35 wt %, of the alkali-soluble resin which is component (A) of the composition of the present invention. The use of these hydroxyaryl compounds as the sensitivity enhancer in addition to components (A), (B) and (C) is a more preferred embodiment of the invention since this contributes further improvements not only in the margin of exposure and depth-of-focus characteristics but also in sensitivity.

In the composition of the invention, the proportion of component (B) is preferably 5–100 wt %, more preferably 10–50 wt %, of the total content of component (A) (alkali-soluble resin) and the optionally added hydroxyaryl compound (sensitivity enhancer). If the proportion of component (B) is smaller than the prescribed lower limit, images of good pattern fidelity are difficult to produce and the transferability tends to decrease. If the proportion of component (B) is greater than the prescribed upper limit, deteriorated sensitivity and the reduced homogeneity of the resist film to be formed will combine to cause a tendency toward lower resolutions. The compounds listed as component (B) may be used either independently or in combination.

Component (C) is a sulfonyl halide represented by the stated general formula (I) (where $R^1$ and X are each the same as defined above). Preferred for the purposes of the invention is a sulfonyl halide represented by the following general formula (II):

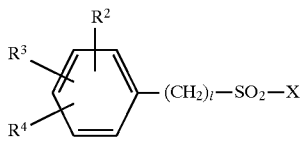

where $R^2$–$R^4$ are each independently a hydrogen atom, an alkyl group, a substituted alkyl group, an aryl group, a substituted aryl group or a $SO_2X$ group; 1 is 0 or an integer of 1–3; and X is a halogen atom.

Specific examples of component (C) include: alkanesulfonyl halides having 1–12 carbon atoms such as methanesulfonyl chloride, methanesulfonyl fluoride, ethanesulfonyl chloride, n-propanesulfonyl chloride, n-butanesulfonyl chloride, pentanesulfonyl chloride and dodecanesulfonyl chloride; substituted alkanesulfonyl halides having 1–12 carbon atoms such as chloromethylsulfonyl chloride, dichloromethylsulfonyl chloride, trichloromethylsulfonyl chloride and 2-chloroethylsulfonyl chloride; alkenesulfonyl chlorides having 2 or 3 carbon atoms such as ethylenesulfonyl chloride and 1-propene-1-sulfonyl chloride; arylsulfonyl halides such as benzenesulfonyl chloride, benzenesulfonyl fluoride, benzylsufonyl chloride, and 1-naphthalenesulfonyl chloride; and alkyl-, alkenyl- and alkoxy-substituted arlysulfonyl halides such as p-toluenesulfonyl chloride, p-ethylbenzenesulfonyl chloride, p-styrenesulfonyl chloride and p-methoxybenzenesulfonyl chloride.

Among these, alkanesulfonyl halides, arylsulfonyl halides and alkyl-substituted arylsulfonyl halides are preferred since they have a good balance between the cross-sectional profile, the margin of exposure and the depth of focus. Benzylsulfonyl chloride, naphthalenesulfonyl chloride and p-toluenesulfonyl chloride are particularly preferred.

The resist solutions having the above-listed sulfonyl halides need not be acidic and they are preferably near neutral from the viewpoint of storage stability and keeping quality. Further, the sulfonyl halides are preferably those compounds which do not have so low boiling points as to sublime away in the step of drying the resist coating. An example of the sulfonyl halides that are satisfactory in overall characteristics including these requirements is p-toluenesulfonyl chloride having a monocyclic aryl group. The sulfonyl halides listed above may be used either independently or in admixture.

The use of the above-described component (C) ensures the formation of less-than-half-a-micron patterns having improved feature or edge integrity and sharply defined rectangular profiles.

The proportion of component (C) can appropriately be varied in accordance with such factors as the types of the substrate, undercoat and the light-sensitive component. Generally, component (C) is added in an amount of from about 0.01 to about 2.00 wt %, preferably from about 0.05 to about 1.00 wt %, of the total solids. If the addition of component (C) is unduly small, the effectiveness of the invention will not be fully exhibited; conversely, if its addition is excessive, the bottom of each resist pattern element will have an "undercut", causing distortions in feature profiles, insufficient etching resistance and other problems. Particularly in the case of forming resist patterns on an anti-reflective film, there is a strong tendency for the top of each pattern element to be narrowed or the bottom to become flared. To avoid these troubles, the component (C) is preferably added in an amount of 0.50–1.00 wt % and if no anti-reflective film is to be provided, the addition of component (C) is preferably less than 0.50 wt %, with the range from about 0.1 to about 0.4 wt % being particularly preferred.

Depending on the need, the composition of the invention may further contain compatible additives to such an extent that they will not be deleterious to the objects of the invention. Specific examples of such additives include: agents for enhancing the margin of exposure and the feature or edge integrity, such as 1,4-bis[1-(3-cyclohexyl-4-hydroxy-6-methylphenyl)isopropyl]benzene; anti-halation UV absorbers such as 2,2',4,4'-tetrahydroxybenzophenone, 4-dimethylamino-2',4'-dihydroxybenzophenone, 5-amino-3-methyl-1-phenyl-4-(4-hydroxyphenylaxo)pyrazole, 4-dimethylamino-4'-hydroxyazobenzene, 4-diethylamino-4'-ethoxyazobenzene, 4-diethylaminoazobenzene and curcumin; and anti-striation surfactants exemplified by fluorine-containing surfactants such as Furolard FC-430 and FC-431 (tradenames of Sumitomo 3M, and F Top EF122A, EF122B, EF122C and EF126 (tradenames of Tohchem Products Co.).

The composition of the invention is preferably used in the form of a solution that is prepared by dissolving the following components in suitable solvents: (A) the alkalisoluble resin; (B) the quinonediazido group containing compound as a light-sensitive component; (C) at least one of the sulfonyl halides of the general formula (I); and any optional additive components, preferably the hydroxyaryl compound of the stated general formula (III) which serves as a sensitivity enhancer.

Exemplary solvents include: ketones such as acetone, methyl ethyl ketone, cyclohexanone, methyl isoamyl ketone and 2-heptanone; polyhydric alcohols such as ethylene glycol, propylene glycol, diethylene glycol, ethylene glycol monoacetate, propylene glycol monoacetate and diethylene glycol monoacetate, and derivatives thereof in ether forms such as monomethyl ether, monoethyl ether, monopropyl ether, monobutyl ether and monophenyl ether; cyclic ethers such as dioxane; and esters such as ethyl lactate, methyl acetate, ethyl acetate, butyl acetate, methyl pyruvate, ethyl pyruvate, methyl methoxypropionate and ethyl ethoxypropinate. These solvents may be used either alone or in admixture.

An example of the preferred method of using the composition of the invention proceeds as follows. A substrate such as a silicon wafer is spun or otherwise coated with a solution having the alkali-soluble resin (A), the quinonediazido group containing compound (B), the sulfonyl halide (C) and any optional additives dissolved in a suitable solvent (see above) and the applied solution is dried to form a light-sensitive layer, which is then exposed via a desired mask pattern either to a UV light source (e.g. a low-pressure mercury lamp, a high-pressure mercury lamp, an ultra-high pressure mercury lamp, an arc lamp or a xenon lamp) or to a scanning electron beam. The substrate is then immersed in an alkaline, aqueous developing solution such as an aqueous solution of 1–10 wt % tetramethylammonium hydroxide (TMAH), whereupon the exposed areas are dissolved away to produce an image having high fidelity to the mask pattern.

The multilayer resist material according to the second aspect of the invention comprises a substrate that is overlaid with an anti-reflective coating which, in turn, is overlaid with the positive photoresist layer formed by application of the composition of the invention. The compounds to form the anti-reflective coating are not limited in any particular way and conventionally known compounds may be used. Advantageous examples include triazine compounds that contain either a thermally crosslinkable methylol or alkoxy group or both and which have UV absorbers added thereto, optionally in combination with alkali-insoluble acrylic resins. Such compounds to form the anti-reflective coating are then dissolved in organic solvents for application to the substrate.

Exemplary triazine compounds that contain either a thermally crosslinkable methylol or alkoxy group or both include melamine and guanamine that contain either a methylol group or an alkoxymethyl group (e.g. methoxymethyl, ethoxymethyl, propoxymethyl or butoxymethyl) or both groups.

Such triazine compounds can easily be prepared by known procedures. In one case, melamine or guanamine is methylated by reaction with formaldehyde in boiling water, optionally followed by reaction with a lower alcohol to effect alkoxylation. Methoxymethylated triazine compounds are commercially available from Sanwa Chemical Co., Ltd. under the tradenames MX-750 (melamine having 3.7 methoxymethyl groups on average) and MW-30 (melamine having 5.8 methoxymethyl groups on average).

Exemplary UV absorbers include 2,2',4,4'-tetrahydroxybenzophenone and curcumin.

Preferred alkali-insoluble acrylic resins are those polymers which are prepared from starting monomers including alkyl (meth)acrylates such as methyl (meth)acrylate, ethyl (meth)acrylate and propyl (meth)acrylate, and glycidyl (meth)acrylate and which have weight average molecular weights in the range of 10,000–100,000, preferably in the range of 20,000–100,000. Particularly preferred are copolymers of glycidyl methacrylate and methyl methacrylate in weight ratios of 2:8–8:2.

The anti-reflective coating is formed by dissolving the above-mentioned components in a suitable organic solvent, applying the resulting solution onto a substrate, drying the applied coating, and baking it at a temperature of 100–300° C.

The organic solvent in which the respective components of the anti-reflective coating are to be dissolved may be of the same types as the organic solvents used to prepare the positive photoresist composition of the invention.

Exemplary substrates that can be used include silicon wafers that may optionally be provided with highly reflective films formed of aluminum or tungsten silicide.

The multilayer resist material according to the second aspect of the invention comprises the substrate that is over-laid with the anti-reflective coating which, in turn, is over-laid with the positive photoresist layer formed from the composition of the invention. For patterning of the positive photoresist layer, exposure and development steps are performed in the manner already described above. With the resulting resist layer used as a mask, the anti-reflective coating is patterned by dry etching with Cl gas or other etchant. In order to prevent unwanted loss in the width of the resist layer during dry etching, it may be subjected to a known silylation process.

The following examples are provided for the purpose of further illustrating the present invention but are in no way to be taken as limiting.

EXAMPLES

In the examples that follow, positive photoresist compositions were evaluated for their performance by the following methods.

Margin of exposure

A sample was spin coated onto a silicon wafer and dried on a hot plate at 90QC for 90 seconds to form a resist film 1.05 $\mu$m thick. The film was exposed on a reduction projection aligner NSR-2005ilOD (NIKON Corp.; NA=0.57) for a length of time that was increased from 0.1 second at 0.01-sec intervals. Thereafter, the wafer was subjected to PFB (post-exposure bake) at 110° C. for 90 seconds, developed in an aqueous solution of 2.38 wt % tetramethylammonium hydroxide at 23° C. for 60 seconds, washed with water for 30 seconds and dried. When the exposure time required for the thickness of the resist film in the exposed area to become zero after development was written as Eth (milliseconds or ms) and the exposure time necessary to produce 0.4-$\mu$m wide lines and spacings at a ratio of 1:1 was written as Eop (milliseconds or ms), the margin of exposure was calculated as Eop/Eth.

Cross-sectional profile

The cross-sectional profile of resist patterns formed in a width of 0.40 $\mu$m was examined by taking pictures with SEM (scanning electron microscope) and evaluated by the following criteria: A, the profile was rectangular and had high edge integrity and good contrast after development; A', the profile had a slight undercut in the bottom of a pattern element but remained substantially rectangular and had high edge integrity and good contrast after development;A', the profile was somewhat tapered and slightly deteriorated in edge integrity and contrast after development; B, the profile had high edge integrity and good contrast after development but there was a considerable undercut in the bottom of a pattern element; C, the profile was tapered and very poor in edge integrity and contrast after development.

Depth of focus

With Eop (the amount of exposure necessary to produce a line-to-spacing ratio of 1:1 for a width of 0.35 $\mu$m) being used as a reference, exposure was performed on a reduction projection aligner NSR-2005ilOD (NIKON Corp.; NA=0.57) under slightly defocused conditions. After development, the resulting resist patterns were examined by SEM microscopy. A maximum value (pm) of defocusing that allowed a rectangular resist pattern to form in a width of 0.35 $\mu$m was designated as the depth of focus.

Example 1

A mixture of m-cresol, p-cresol, 2,3,5-trimethylphenol and 2,5-xylenol in a molar ratio of 4:4:1:1 was subjected to polycondensation with formaldehyde in the usual manner using an oxalic acid catalyst. The resulting alkali-soluble resin was freed of the lower-molecular weight fraction to provide the desired alkali-soluble resin having a weight-average molecular weight of 7,000. A hundred parts by weight of this alkali-soluble resin, 24 parts by weight of bis(4-hydroxy-2,3,5-trimethylphenyl)-2-hydroxyphenylmethane (sensitizer), 43 parts by weight of the product of esterification a 1:1 (by wt.) mixture (1 mole) of bis[2-hydroxy-3(2-hydroxy-5-methylbenzyl-5-methylphenyl]methane/bis(2-methyl-4-hydroxy-5-cyclohexylphenyl)-3,4-dihydroxyphenylmethane with naphthoquinone-1,2-diazido-5-sulfonyl chloride (2 moles) as a light-sensitive component and 0.5 parts by weight of p-toluenesulfonyl chloride (0.3 wtt of the total solids) were dissolved in 480 parts by weight of 2-heptanone. The resulting solution was passed through a membrane filter having a pore size of 0.2 $\mu$m, thereby producing a positive photoresist composition.

The photoresist composition was evaluated for the margin of exposure, the cross-sectional profile and the depth of focus. The results are shown in Table 1 below.

Example 2

A positive photoresist composition was prepared as in Example 1, except that the p-toluenesulfonyl chloride was replaced by methane sulfonyl chloride. The photoresist composition was evaluated for the margin of exposure, the cross-sectional profile and the depth of focus. The results are shown in Table 1 below.

Example 3

A positive photoresist composition was prepared as in Example 1, except that the p-toluenesulfonyl chloride was replaced by benzenesulfonyl chloride. The photoresist composition was evaluated for the margin of exposure, the cross-sectional profile and the depth of focus. The results are shown in Table 1 below.

Example 4

A positive photoresist composition was prepared as in Example 1, except that the p-toluenesulfonyl chloride was replaced by benzylsulfonyl chloride. The photoresist composition was evaluated for the margin of exposure, the cross-sectional profile and the depth of focus. The results are shown in Table 1 below.

Example 5

A positive photoresist composition was prepared as in Example 1, except that the p-toluenesulfonyl chloride was replaced by naphthalenesulfonyl chloride. The photoresist composition was evaluated for the margin of exposure, the cross-sectional profile and the depth of focus. The results are shown in Table 1 below.

Example 6

A positive photoresist composition was prepared as in Example 1, except that the addition of p-toluenesulfonyl chloride was increased to 2.5 parts by weight (1.5 wt % of the total solids). The photoresist composition was evaluated for the margin of exposure, the cross-sectional profile and the depth of focus. The results are shown in Table 1 below.

Example 7

A positive photoresist composition was prepared as in Example 1, except that 1,4-bis[1-(3-cyclohexyl-4-hydroxy-6methylphenyl)isopropyl]benzene was added in an amount of 1.5 parts by weight. The photoresist composition was evaluated for the margin of exposure, the cross-sectional profile and the depth of focus. The results are shown in Table 1 below.

Comparative Example 1

A positive photoresist composition was prepared as in Example 1, except that p-toluenesulfonyl chloride was not added. The photoresist composition was evaluated for the margin of exposure, the cross-sectional profile and the depth of focus. The results are shown in Table 1 below.

Comparative Example 2

A positive photoresist composition was prepared as in Example 1, except that p-toluenesulfonyl chloride was replaced by p-toluenesulfonic acid. The photoresist composition was evaluated for the margin of exposure, the cross-sectional profile and the depth of focus. The results are shown in Table 1 below.

ExamDle 8

A positive photoresist composition was prepared as in Example 1, except for the use of a silicon wafer having an anti-reflective film (SWK-T5D60 of Tokyo Ohka Kogyo Co., Ltd.) formed in a thickness of 1,500Å. The photoresist composition was evaluated for the margin of exposure, the cross-sectional profile and the depth of focus. The results are shown in Table 1 below.

Example 9

A positive photoresist composition was prepared as in Example 8, except that the addition of p-toluenesulfonyl chloride was increased to 1.2 parts by weight (0.7 wt % of the total solids). The photoresist composition was evaluated for the margin of exposure, the cross-sectional profile and the depth of focus. The results are shown in Table 1 below.

Example 10

A positive photoresist composition was prepared as in Example 8, except that the addition of p-toluenesulfonyl chloride was further increased to 3.7 parts by weight (2.2 wt % of the total solids). The photoresist composition was evaluated for the margin of exposure, the cross-sectional profile and the depth of focus. The results are shown in Table 1 below.

Comparative Example 3

A positive photoresist composition was prepared as in Example 8, except that p-toluenesulfonyl chloride was not added. The photoresist composition was evaluated for the margin of exposure, the cross-sectional profile and the depth of focus. The results are shown in Table 1 below.

Example 11

A mixture of m-cresol, p-cresol and 2,3,5-trimethylphenol in a molar ratio of 4:3:3 was subjected to polycondensation with formaldehyde using an oxalic acid catalyst so as to synthesize a novolac resin. In a separate step, a mixture of m-cresol and p-cresol in a molar ratio of 4:6 was subjected to polycondensation with formaldehyde using an oxalic acid catalyst so as to synthesize another novolac resin. A hundred parts by weight of a 1:1 mixture (Mw=4,000) of the two alkali-soluble novolac resins, 30 parts by weight of a 1:1 mixture (sensitivity enhancer) of 4,6-bis(1-(4-hydroxyphenyl)-isopropyl]resorcin and bis(4-hydroxy-2,3, 5-trimethylphenyl)-2-hydroxyphenylmethane, 50 parts by weight of the product of esterification (light-sensitive component) of bis[4-hydroxy-3(2-hydroxy-5-methylbenzyl)-2,5-dimethylphenyl]methane (1 mole) with naphthoquinone-1,2-diazido-5-sulfonyl chloride (2 moles), as well as 0.9 parts by weight of p-toluenesulfonyl chloride and 4.0 parts by weight of 1,4-bis[1-(3-cyclohexyl-4-hydroxy-6-methylphenyl)isopropyl]benzene were subjected to the same procedure as Example 1 in order to prepare a positive photoresist composition.

The photoresist composition was evaluated for the margin of exposure, the cross-sectional profile and the depth of focus. The results are shown in Table 1 below.

TABLE 1

| Run No. | Component (C) compound name | content, wt % | Evaluation of characteristics margin of exposure | cross-sectional profile | depth of focus |
|---|---|---|---|---|---|
| Example 1 | p-toluene-sulfonyl chloride | 0.3 | 2.2 | A | 1.7 |
| Example 2 | methane-sulfonyl chloride | 0.3 | 2.1 | A" | 1.6 |
| Example 3 | benzene-sulfonyl chloride | 0.3 | 2.1 | A | 1.6 |
| Example 4 | benzyl-sulfonyl chloride | 0.3 | 2.2 | A | 1.6 |
| Example 5 | naphthalene-sulfonyl chloride | 0.3 | 2.1 | A" | 1.5 |
| Example 6 | p-toluene-sulfonyl chloride | 1.5 | 2.3 | A' | 1.8 |
| Example 7 | p-toluene-sulfonyl chloride | 0.3 | 2.5 | A | 1.8 |
| Example 8 | p-toluene-sulfonyl chloride | 0.4 | 2.2 | A" | 1.6 |
| Example 9 | p-toluene-sulfonyl chloride | 0.7 | 2.2 | A | 1.7 |
| Example 10 | p-toluene-sulfonyl chloride | 2.2 | 2.4 | B | 1.5 |
| Comparative Example 1 | — | — | 2.0 | C | 1.4 |
| Comparative Example 2 | p-toluene-sulfonyl chloride | 0.4 | 1.8 | C | 1.0 |
| Comparative Example 3 | — | — | 2.0 | C | 1.1 |
| Example 11 | p-toluene-sulfonyl chloride | 0.5 | 2.2 | A | 1.6 |

As described in detail on the foregoing, the positive photoresist composition of the invention is capable of forming very fine (<0.4 μm) resist patterns that have high feature or edge integrity, provide good contrast between exposed and unexposed areas after development and assure a wider margin of exposure, better depth-of-focus characteristics and sharper cross-sectional profiles. The same advantages are achieved by the multilayer resist material of the invention which employs this positive photoresist composition.

What is claimed is:

1. A positive photoresist composition comprising:
(A) an alkali-soluble resin;
(B) a quinonediazido group containing compound; and
(C) at least one sulfonyl halide represented by the following general formula (II):

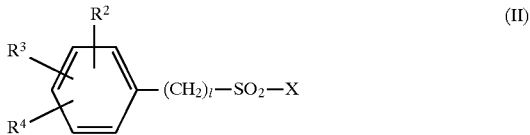

where $R^2$–$R^4$ are each independently a hydrogen atom, an alkyl group, a substituted alkyl group, an aryl group, a substituted aryl group or a $SO_2X$ group where X is a halogen atom; l is either 0 or an integer of 1–3.

2. The positive photoresist composition according to claim 1, wherein component (C) is at least one member of the group consisting of benzylsulfonyl chloride, naphthalenesulfonyl chloride and p-toluenesulfonyl chloride.

3. The positive photoresist composition according to claim 1, wherein the content of component (C) is 0.01–2.00 wt % of the total solids.

4. The positive photoresist composition according to claim 1, wherein component (A) is a novolac resin.

5. The positive photoresist composition according to claim 1, wherein component (B) is the product of esterification of a hydroxylaryl compound with a naphthoquinone-1,2-diazidosulfonyl acid compound, said hydroxylaryl compound being represented by the following general formula (III):

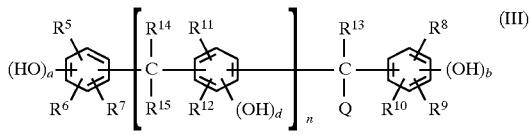

where $R^5$–$R^{12}$ are each independently a hydrogen atom, a halogen atom, an alkyl group having 1–6 carbon atoms, an alkoxy group having 1–6 carbon atoms or a cycloalkyl group; $R^{13}$–$R^5$ are each independently a hydrogen atom or an alkyl group having 1–6 carbon atoms; Q is a hydrogen atom, an alkyl group having 1–6 carbon atoms or, when taken together with $R^{13}$, represents a cyclic ring having 3–6 carbon atoms, or a residue represented by the following formula:

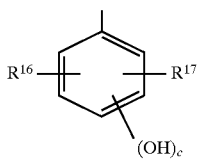

(where $R^{16}$ and $R^{17}$ are each independently a hydrogen atom, a halogen atom, an alkyl group having 1–6 carbon atoms, an alkoxyl group having 1–6 carbon atoms or a cycloalkyl group; c is an integer of 1–3); a and b are each an integer of 1–3; d is an integer of 0–3; and n is an integer of 0–2.

6. The positive photoresist composition according to claim 1, wherein component (B) Is the product of esterification of a hydroxyaryl compound with a naphthoquinone-1,2-diazidosulfonic acid compound, said hydroxyaryl compound being represented by the following general formula (IV):

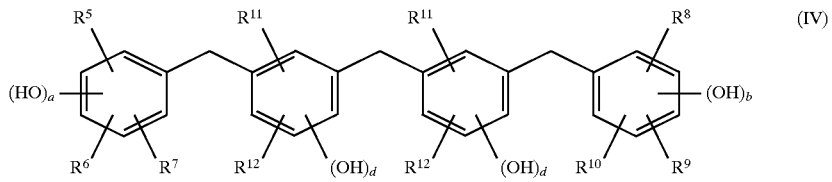

where $R^5$–$R^{12}$ are each independently a hydrogen atom, a halogen atom, an alkyl group having 1–6 carbon atoms, an alkoxy group having 1–6 carbon atoms or a cycloalkyl group; a and b are each an integer of 1–3; and d is an integer of 0–3.

7. The positive photoresist composition according to claim 1, which further contains a hydroxyaryl compound of the following general formula (III) as a sensitivity enhancer:

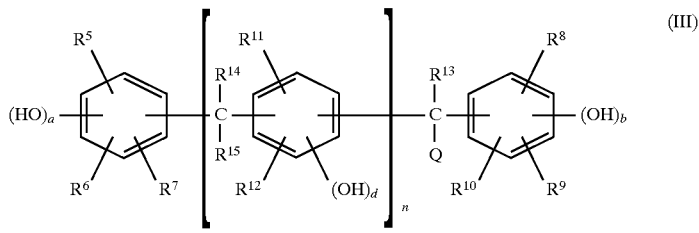

where $R^5$–$R^{12}$ are each independently a hydrogen atom, a halogen atom, an alkyl group having 1–6 carbon atoms, an alkoxyl group having 1–6 carbon atoms or a cycloalkyl group; $R^{13}$–$R^{15}$ are each independently a hydrogen atom or an alkyl group having 1–6 carbon atoms; Q is a hydrogen atom, an alkyl group having 1–6 carbon atoms or, when taken together with $R^{13}$, represents a cyclic ring having 3–6 carbon atoms, or a residue represented by the following formula:

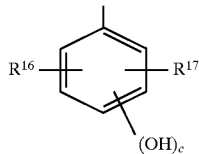

(where $R^{16}$ and $R^{17}$ are each independently a hydrogen atom, a halogen atom, an alkyl group having 1–6 carbon atoms, an alkoxyl group having 1–6 carbon atoms or a cycloalkyl group; c is an integer of 1–3); a and b are each an integer of 1–3; d is an integer of 0–3; and n is an integer of 0–2.

8. The positive photoresist composition according to claim 1, which further contains 1,4-bis[1-(3-cyclohexyl-4-hydroxy-6-methylphenyl)isopropyl)benzene.

9. A multilayer resist material comprising a substrate overlaid with an anti-reflective coating which, In turn, is overlaid with a positive photoresist layer, said positive photoresist layer being formed of the positive photoresist composition according to claim 1.

10. The positive photoresist composition according to claim 5, which further contains 1,4-bis[1-(3-cyclohexyl-4-hydroxy-6-methylphenyl) isopropyl]benzene.

* * * * *

UNITED STATES PATENT AND TRADEMARK OFFICE
CERTIFICATE OF CORRECTION

PATENT NO. : 5,853,948
DATED : December 29, 1998
INVENTOR(S) : Atsushi SAWANO et al.

It is certified that error appears in the above-identified patent and that said Letters Patent is hereby corrected as shown below:

Column 12, line 19, "90QC" should read -- 90°C --;
column 12, lines 21 and 53, "NSR-2005i10D" should read -- NSR-2005i10D --;
column 12, line 42, "A'" should read -- A" --;
column 12, line 56, "(pm)" should read -- ($\mu$m) --;
Column 13, line 11, "wtt" should read -- wt % --;
column 13, line 66, "6methyl..." should read -- 6-methyl... --;
Column 14, line 21, "ExamDle 8" should read -- Example 8 --;
column 14, line 66, "bis(1-..." should read -- bis[1-... --;

UNITED STATES PATENT AND TRADEMARK OFFICE
CERTIFICATE OF CORRECTION

PATENT NO. : 5,853,948
DATED : December 29, 1998
INVENTOR(S) : Atsushi SAWANO et al.

It is certified that error appears in the above-identified patent and that said Letters Patent is hereby corrected as shown below:

Claim 5, line 42 of formula III, "$R^5$" should read -- $R^{15}$ --;

Claim 6, line 2, "Is" should read -- is --;

Claim 9, line 2, "In" should read -- in --.

Signed and Sealed this

Twenty-fourth Day of August, 1999

Attest:

Q. TODD DICKINSON

*Attesting Officer*   *Acting Commissioner of Patents and Trademarks*